(12) United States Patent
You et al.

(10) Patent No.: US 12,066,646 B2
(45) Date of Patent: Aug. 20, 2024

(54) POLARIZING PLATE AND OPTICAL DISPLAY DEVICE COMPRISING SAME

(71) Applicant: SAMSUNG SDI CO., LTD., Yongin-si (KR)

(72) Inventors: Jung Hun You, Suwon-si (KR); Sang Hum Lee, Suwon-si (KR); Jun Mo Koo, Suwon-si (KR); Bong Choon Kim, Suwon-si (KR); Kwang Ho Shin, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 18/005,591

(22) PCT Filed: Aug. 3, 2021

(86) PCT No.: PCT/KR2021/010104
§ 371 (c)(1),
(2) Date: Jan. 13, 2023

(87) PCT Pub. No.: WO2022/030929
PCT Pub. Date: Feb. 10, 2022

(65) Prior Publication Data
US 2023/0273358 A1 Aug. 31, 2023

(30) Foreign Application Priority Data
Aug. 4, 2020 (KR) .................. 10-2020-0097685

(51) Int. Cl.
*G02B 5/30* (2006.01)
*G02F 1/1335* (2006.01)

(52) U.S. Cl.
CPC ..... *G02B 5/3033* (2013.01); *G02F 1/133528* (2013.01)

(58) Field of Classification Search
CPC ............ G02F 1/133528; G02F 1/1335; G02B 5/3033; G02B 1/14; G02B 5/30; H01L 27/146
See application file for complete search history.

(56) References Cited

U.S. PATENT DOCUMENTS

| | | | |
|---|---|---|---|
| 2003/0189275 A1* | 10/2003 | Cael ................. | G02B 5/3033 264/2.6 |
| 2006/0028725 A1* | 2/2006 | Gerlach ............. | G02B 5/3033 359/487.06 |

(Continued)

FOREIGN PATENT DOCUMENTS

| | | |
|---|---|---|
| JP | 2014-081482 A | 5/2014 |
| KR | 10-2015-0004015 A | 1/2015 |

(Continued)

OTHER PUBLICATIONS

Korean Office Action dated Aug. 21, 2023 issued in corresponding Korean Patent Application No. 10-2020-0097685 (4 pages).

(Continued)

*Primary Examiner* — Hoan C Nguyen
(74) *Attorney, Agent, or Firm* — Lewis Roca Rothgerber Christie LLP (57) ABSTRACT

Provided are a polarizing plate and an optical display device comprising same, the polarizing plate comprising a polarizer and a protective layer formed on at least one surface of the polarizer, wherein: the polarizing plate comprises a first area and a second area formed within an image display area; the first area and the second area have different single transmittances in the same wavelength; and the first area has a single transmittance of 45% to 85%, a maximum absorbance of 1.0 to 5.0 in a wavelength in a range from about 270 nm to about 325 nm, a maximum absorbance of 0.5 to 4.0 in a wavelength which exceeds about 325 nm and is lower than or (Continued)

equal to 420 nm, and a maximum absorbance of 0.5 or less in a wavelength in a range from about 500 nm to about 800 nm.

18 Claims, 3 Drawing Sheets

(56) References Cited

U.S. PATENT DOCUMENTS

| | | | | |
|---|---|---|---|---|
| 2008/0112049 A1* | 5/2008 | Umemoto | ............... | G02B 5/23 |
| | | | | 359/489.07 |
| 2015/0131035 A1* | 5/2015 | Chen | ............... | G02F 1/133533 |
| | | | | 427/163.1 |
| 2016/0195653 A1* | 7/2016 | Lee | ................. | G02B 5/305 |
| | | | | 427/163.1 |
| 2016/0320538 A1 | 11/2016 | Kunai | | |
| 2017/0090086 A1* | 3/2017 | Goto | ............... | C09D 129/04 |
| 2018/0067348 A1 | 3/2018 | Hatanaka | | |

FOREIGN PATENT DOCUMENTS

| | | | |
|---|---|---|---|
| KR | 10-2016-0102478 A | 8/2016 | |
| KR | 10-2017-0127013 A | 11/2017 | |
| KR | 10-2018-0081197 A | 7/2018 | |
| KR | 10-2019-0030522 A | 3/2019 | |
| KR | 10-2019-0109365 A | 9/2019 | |
| WO | WO-2019155791 A1 * | 8/2019 | ............. B32B 7/023 |

OTHER PUBLICATIONS

International Search Report of PCT/KR2021/010104, Nov. 9, 2021, 4 pages.

* cited by examiner

POLARIZING PLATE AND OPTICAL DISPLAY DEVICE COMPRISING SAME

CROSS-REFERENCE TO RELATED APPLICATIONS

This application is a U.S. National Phase Patent Application of International Application Number PCT/KR2021/010104, filed on Aug. 3, 2021, which claims priority to Korean Patent Application Number 10-2020-0097685, filed on Aug. 4, 2020, the entire content of each of which is incorporated herein by reference.

TECHNICAL FIELD

The present invention relates to a polarizing plate and an optical display device including the same.

BACKGROUND ART

A polarizing plate is provided to an optical display device to display an image or to improve image quality. In a mobile display, such as a mobile phone and the like, the polarizing plate may be used as an intermediate path for an image sensor, such as a camera and the like, to photograph a picture or a video.

Figure 5:
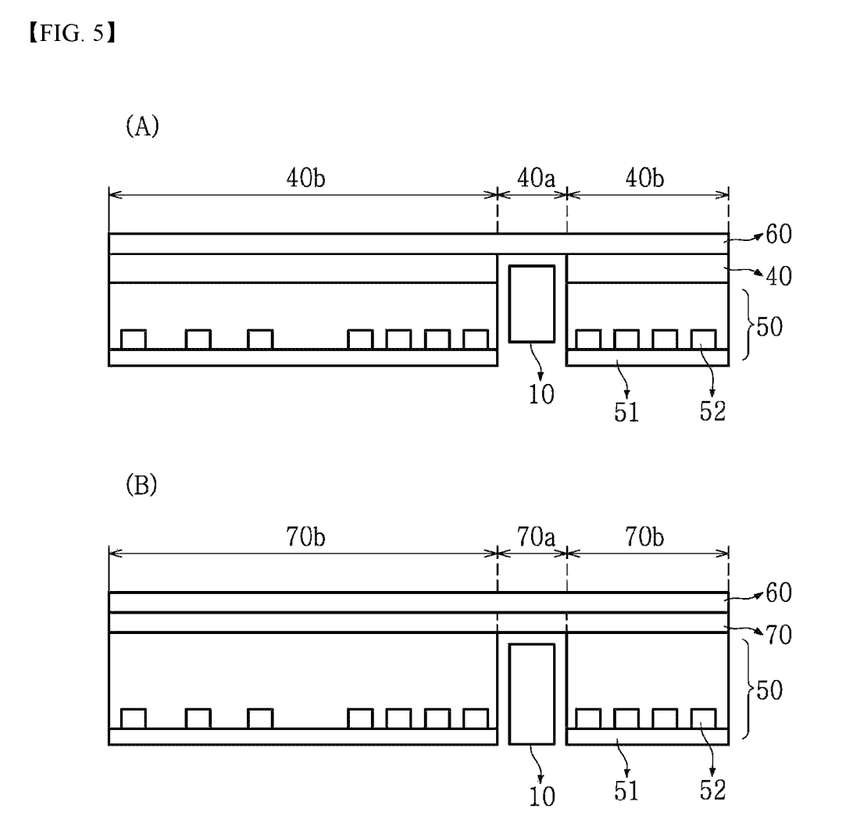
FIG. 5 is a sectional view of a typical optical display device including an image sensor.

Referring to FIG. 5(A), an optical display device includes a display panel 50, which includes a base layer 51 and a plurality of light emitting diodes 52, a polarizing plate 40 formed on the display panel 50, a cover glass 60 formed on the polarizing plate 40, and an image sensor 10 disposed to pass through a portion of the display panel 50. The image sensor 10 is disposed inside the polarizing plate 40 to pass through a portion of the polarizing plate 40. A region 40a of the polarizing plate 40 corresponding to the image sensor is a non-image display region. In order to secure a space receiving the image sensor 10 therein, the polarizing plate 40 is machined by a physical punching method. In this case, however, the image display region 40b can provide a poor image due to cracks in a region around a punched region for the region 30a of the polarizing plate 40.

Referring to FIG. 5(B), the optical display device may include a polarizing plate 70, which is formed with a region 70a for operating the image sensor 10 and an image display region 70b by a chemical or optical method, instead of physical punching of the polarizing plate 40, as shown in FIG. 5(A). In this case, the region 70a corresponds to a non-image display region. In addition, the display panel 50 including the light emitting diodes is divided by the image sensor 10, thereby making it difficult to perform machining and the like.

In recent years, an optical display device including an image sensor disposed at a lower portion thereof is developed in the art, instead of defining a region for the image sensor penetrating a portion of the display panel including the light emitting diodes to secure a space for the image sensor, as shown in FIG. 5(A) and FIG. 5(B).

In this case, a region of the polarizing plate corresponding to the image sensor is also required to perform an image display function and to prevent visual observation of the image sensor at the outside in the course of performing the image display function while providing a clear image in the course of photographing. However, there is a limit to use of a typical polarizing plate in the above optical display device.

The background technique of the present invention is disclosed in Japanese Unexamined Patent Publication No. 2014-081482 and the like.

DISCLOSURE

Technical Problem

It is one aspect of the present invention to provide a polarizing plate, which is applied to an optical display device provided with an image sensor, such as a camera and the like, in an image display region thereof and can perform an image display function through suppression of visual observation of the image sensor at the outside in non-use of the image sensor while increasing resolution of an image in use of the image sensor.

It is another aspect of the present invention to provide a polarizing plate having good durability.

Technical Solution

One aspect of the present invention relates to a polarizing plate.

1. The polarizing plate includes: a polarizer; and a protective layer formed on at least one surface of the polarizer, and wherein the polarizing plate has a first region and a second region in an image display region, wherein the first region and the second region have different total transmittances at the same wavelength; and wherein the first region has a total transmittance of 45% to 85%, wherein the first region has a maximum absorbance of 1.0 to 5.0 in the wavelength range of about 270 nm to about 325 nm, a maximum absorbance of 0.5 to 4.0 in the wavelength range of greater than about 325 nm to about 420 nm, and a maximum absorbance of 0.5 or less in the wavelength range of about 500 nm to about 800 nm.

2. The polarizing plate includes a polarizer and a protective layer formed on at least one surface of the polarizer, wherein the polarizer includes a first region and a second region in an image display region, the first region and the second region having different total transmittances at the same wavelength; and the first region has a total transmittance of 45% to 85%, the first region has a maximum absorbance of 1.0 to 5.0 in the wavelength range of about 270 nm to about 325 nm, a maximum absorbance of 0.5 to 4.0 in the wavelength range of greater than about 325 nm to about 420 nm, and a maximum absorbance of 0.5 or less in the wavelength range of about 500 nm to about 800 nm.

3. The polarizing plate includes a polarizer and a protective layer formed on at least one surface of the polarizer, and wherein the polarizing plate has a first region and a second region in an image display region, wherein the first region and the second region have different total transmittances at the same wavelength; and the first region has a total transmittance variation rate of 10% or less, as calculated by Equation 1:

$$\text{Total transmittance variation rate} = (TS1-TS2)/TS1 \times 100 \quad \text{[Equation 1]}$$

(In Equation 1,

TS1 is total transmittance of the first region at a wavelength of 550 nm (unit: %), and TS2 is total transmittance of the first region at a wavelength of 550 nm (unit: %) after the polarizing plate is left under condition of 85° C. for 120 hours or under condition of 85° C. and 85% relative humidity (RH) for 120 hours (unit: %).

4. In 1 and 2, the first region may have a maximum absorbance of greater than 1.0 to 5.0 in the wavelength range of about 270 nm to about 325 nm and a maximum absorbance of greater than 0.5 to 4.0 in the wavelength range of greater than about 325 nm to about 420 nm.

5. In 1, 2 and 4, in the first region, the maximum absorbance in the wavelength range of about 270 nm to about 325 nm may be higher than the maximum absorbance in the wavelength range of greater than about 325 nm to about 420 nm.

6. In 1, 2, 4 and 5, the second region may have a lower maximum absorbance in the wavelength range of about 270 nm to about 420 nm than the first region and may have a higher maximum absorbance in the wavelength range of greater than about 420 nm to about 800 nm than the first region.

7. In 6, the second region may have a maximum absorbance of 0.5 to 3.0 in the wavelength range of about 270 nm to about 420 nm and a maximum absorbance of 0 to 0.6 in the wavelength range of greater than about 420 nm to about 800 nm.

8. In 1, 2, and 4 to 7, a difference in total transmittance between the first region and the second region may be in the range of 5% to 45%.

9. In 1, 2 and 4 to 8, the first region may have a lower total transmittance in the wavelength range of about 270 nm to about 420 nm than the second region and may have a higher total transmittance in the wavelength range of greater than about 420 nm to about 800 nm than the second region.

10. In 1, 2, and 4 to 9, the first region may have a total transmittance of 15% or less in the wavelength range of about 270 nm to about 325 nm, a total transmittance of 25% or less in the wavelength range of greater than about 325 nm to about 420 nm, and a total transmittance of 45% or more in the wavelength range of about 500 nm to about 800 nm.

11. In 3, the first region may have a total transmittance of 45% to 85% and may have a maximum absorbance of 1.0 to 5.0 in the wavelength range of about 270 nm to about 325 nm, a maximum absorbance of 0.5 to 4.0 in the wavelength range of greater than about 325 nm to about 420 nm, and a maximum absorbance of 0.5 or less in the wavelength range of about 500 nm to about 800 nm.

12. In 3 and 11, the first region may have a maximum absorbance of greater than 1.0 to 5.0 in the wavelength range of about 270 nm to about 325 nm and a maximum absorbance of greater than 0.5 to 4.0 in the wavelength range of greater than about 325 nm to about 420 nm.

13. In 3, 11, and 12, the second region may have a maximum absorbance of 0.5 to 3.0 in the wavelength range of about 270 nm to about 420 nm and a maximum absorbance of 0 to 0.6 in the wavelength range of greater than about 420 nm to about 800 nm.

Another aspect of the present invention relates to an optical display device including the polarizing plate according to the present invention.

The optical display device may include a display panel, the polarizing plate formed on an upper surface of the display panel, an image sensor formed under the display panel, wherein the image sensor may be disposed under the first region of the polarizing plate.

Advantageous Effects

The present invention provides a polarizing plate, which is applied to an optical display device provided with an image sensor, such as a camera and the like, in an image display region thereof and can perform an image display function through suppression of visual observation of the image sensor at the outside in non-use of the image sensor while increasing resolution of an image in use of the image sensor.

The present invention provides a polarizing plate having good durability.

BEST MODE

Hereinafter, embodiments of the present invention will be described in detail with reference to the accompanying drawings such that the present invention can be easily implemented by those skilled in the art. It should be understood that the present invention may be embodied in different ways and is not limited to the following embodiments.

In the drawings, components unrelated to description are omitted for clear description of the invention and like components will be denoted by like reference numerals throughout the specification. Although lengths, thicknesses or widths of various components may be exaggerated for understanding in the drawings, the present invention is not limited thereto.

Herein, spatially relative terms, such as "upper" and "lower", are defined with reference to the accompanying drawings. Thus, it will be understood that "upper surface" can be used interchangeably with "lower surface".

Herein, "absorbance" means total light absorbance.

Herein, "total transmittance (Ts)" and "degree of polarization" of a polarizing plate are values measured at a wavelength of 200 nm to 800 nm, preferably at a wavelength of 550 nm.

Herein, with regard to "total transmittance of the first region", the first region has the same total transmittance in an overall region thereof even at the same wavelength. However, when the total transmittance is not the same in the overall region of the first region at the same wavelength, the total transmittance of the first region means average value of total transmittances thereof.

Herein, with regard to "total transmittance of the second region", the second region has the same total transmittance in an overall region thereof even at the same wavelength. However, when the total transmittance is not the same in the overall region of the second region at the same wavelength, the total transmittance of the second region means average value of total transmittances thereof.

Herein, "average value of total transmittance" means an average value of total transmittances in the region within which the average value of total transmittances is to be measured. For example, the average value of total transmittance may be obtained from an average value of total transmittances measured at a plurality of points arbitrarily designated in a region where the average value of total transmittances is to be measured.

As used herein to represent a specific numerical range, "X to Y" means "greater than or equal to X and less than or equal to Y (X≤ and ≤Y)".

A polarizing plate according to the present invention may be applied to an optical display device in which an image sensor (for example, a camera) is provided in an image display region. The polarizing plate according to the present invention allows the image display function to be efficiently performed by minimizing visual observation of the image sensor at the outside through suppression in visual observation of the image sensor at the outside in non-use of the image sensor. The polarizing plate according to the present invention can increase resolution of an image such as a picture or a video provided by the image sensor in use of the image sensor. Further, the polarizing plate according to the present invention has good durability in a first region at high temperature or under high temperature/humidity conditions. Further, regardless of formation of the first region and the second region, the polarizing plate according to the present invention has an antireflection function to be used as an antireflective polarizing plate for prevention of reflection in a light emitting diode display, for example, an organic light emitting diode display device, which is provided with a light emitting display panel. The first region and the second region will be described in detail below.

Hereinafter, a polarizing plate according to one embodiment of the invention will be described in detail.

The polarizing plate includes a first region and a second region in an image display region.

Here, "image display region" means a region in which an image is displayed on an optical display device adopting the polarizing plate. The image display region may occupy 90% to 100%, preferably 100% of the polarizing plate. In one embodiment, the polarizing plate may not include a non-image display region. Here, "non-image display region" means a region formed around the image display region to prevent a bezel, electrodes and the like from being observed through a light shielding layer and the like.

The first region and the second region have different total transmittances at the same wavelength. The first region may perform an external image-photographing function through an image sensor, such as a camera and the like, unlike the second region, while the first region and the second region perform an image display function.

The first region has a total transmittance of 45% to 85%. Within this range, the first region can sufficiently realize the image display function through suppression of visual observation of the image sensor at the outside in non-use of the image sensor, while increasing resolution of an image through the image sensor in use of the image sensor. Preferably, the first region has a total transmittance of 50% to 85%, 50% to 70%, or 50% to 60%.

With the above light transmittance, the first region according to the present invention can realize all of the aforementioned effects in a laminate of the image sensor, a light emitting diode-containing display panel, and the polarizing plate in the optical display device. The light emitting diode-containing display panel and the image sensor are sequentially disposed under the first region, whereby the polarizing plate according to the present invention can perform the image display function and the external image-photographing function at the same time. An optical display device according to one embodiment of the present invention will be described below in detail.

The second region performs only the image display function, which is irrelevant of the image-photographing function realized by the image sensor in the optical display device. Accordingly, the second region has lower light transmittance than the first region.

In one embodiment, a difference in total transmittance between the first region and the second region may be in the range of 5% to 45%, specifically 5%, 10%, 15%, 20%, 25%, 30%, 35%, 40%, or 45%, more specifically 5% to 41%, or 5% to 20%. Within this range, the optical display device including the polarizing plate can realize a uniform image over the entire screen through reduction in image difference between the first region provided with a camera and the second region provided with no camera while preventing the camera from being observed at the outside.

The second region may have a total transmittance of 40% to less than 50%, specifically 40% to 45%. Within this range, the second region can efficiently realize the image display function.

Although the first region and the second region may have the same degree of polarization, it is desirable that the first region have a lower degree of polarization than the second region in consideration of a process of forming the first region described below.

In one embodiment, the first region may have a degree of polarization of 5% to 85%, specifically 50% to about 75%. Within this range, the first region does not obstruct recognition of an object by the camera. In one embodiment, the second region may have a degree of polarization of about 90% or more, specifically about 90% to 100%. Within this range, the second region can provide an antireflection effect with respect to external light.

According to the present invention, the maximum absorbance of the first region at a specific wavelength range is controlled within a specific range in order to realize the image display function through suppression of visual observation of the image sensor at the outside in non-use of the image sensor while increasing resolution of an image through the image sensor in use of the image sensor and improving durability of the first region at high temperature or under high temperature/humidity conditions. Here, "durability" means that the first region has low variation rates in total transmittance and/or polarization degree when the polarizing plate according to the present invention is left at high temperature or under high temperature/humidity conditions for a long period of time.

In one embodiment, the first region of the polarizing plate may have a total transmittance variation rate of 10% or less, specifically 5% or less, for example, 0% to 5%, as calculated by Equation 1. Within this range, the first region can exhibit good durability to improve reliability of an optical display device.

$$\text{Total transmittance variation rate} = (TS1-TS2)/TS1 \times 100 \quad \text{[Equation 1]}$$

(In Equation 1,

TS1 is the total transmittance of the first region at a wavelength of 550 nm (unit: %), and TS2 is the total transmittance of the first region at a wavelength of 550 nm after the polarizing plate is left under condition of 85° C. for 120 hours or under condition of 85° C. and 85% RH for 120 hours (unit: %))

In one embodiment, the first region of the polarizing plate has a polarization variation rate of 20% or less, specifically 10% or less, for example, 0% to 10%, as calculated by Equation 2. Within this range, the first region can exhibit good durability to improve reliability of an optical display device.

Polarization variation rate=(PD2−PD1)/PD1×100  [Equation 2]

(In Equation 2,

PD1 is the degree of polarization of the first region at a wavelength of 550 nm (unit: %), and PD2 is the degree of polarization of the first region at a wavelength of 550 nm after the polarizing plate is left under condition of 85° C. for 120 hours or under condition of 85° C. and 85% RH for 120 hours (unit: %))

The first region has a total transmittance of 45% to 85%, and the first region has a maximum absorbance of 1.0 to 5.0 in the wavelength range of about 270 nm to about 325 nm, a maximum absorbance of 0.5 to 4.0 in the wavelength range of greater than about 325 nm to about 420 nm, and a maximum absorbance of 0.5 or less in the wavelength range of about 500 nm to about 800 nm. With this configuration, the polarizing plate can efficiently realize the image display function through suppression of visual observation of the image sensor at the outside in non-use of the image sensor while increasing resolution of an image through the image sensor in use of the image sensor, when applied to an optical display device shown in FIG. 4. In addition, the first region can have improved durability at high temperature or under high temperature/humidity conditions.

Figure 1:
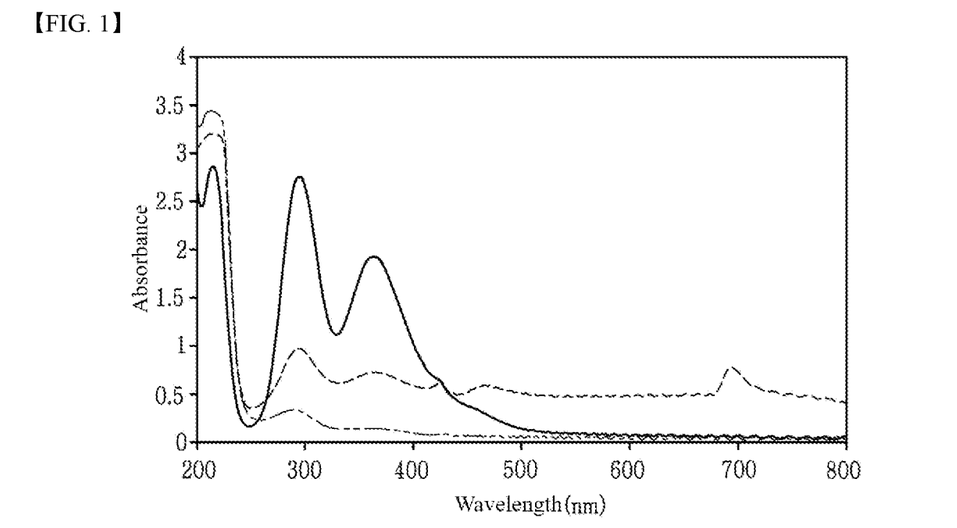
FIG. 1 is a graph depicting a relationship between wavelength and absorbance of a first region in each of polarizing plates (or polarizers) according to one embodiment of the present invention, Comparative Example 1, and Comparative Example 2.
Figure 2:
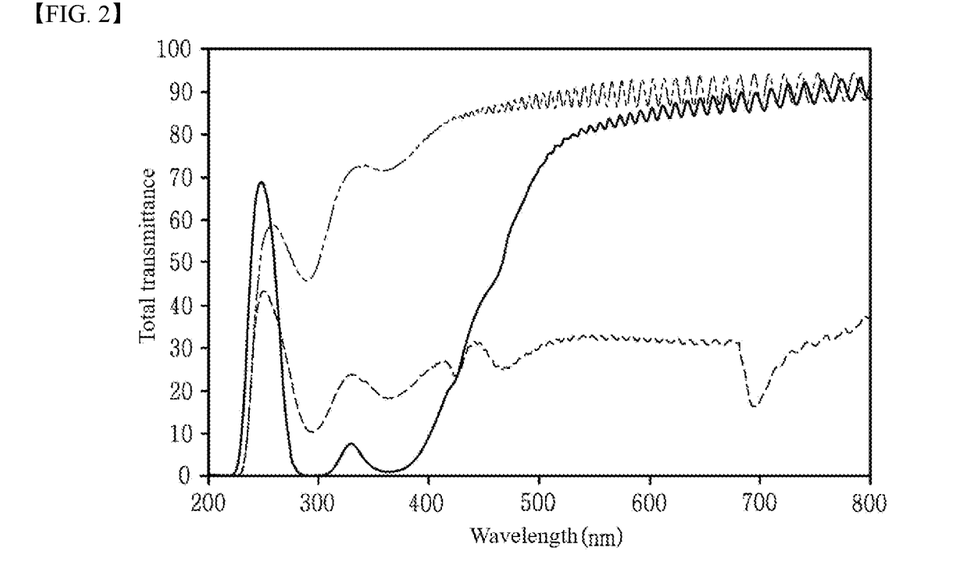
FIG. 2 is a graph depicting a relationship between wavelength and total transmittance of a first region in each of polarizing plates (or polarizers) according to one embodiment of the present invention, Comparative Example 1, and Comparative Example 2.

Referring to FIG. 1 and FIG. 2, the polarizing plate according to the present invention will be described in more detail.

In FIG. 1 and FIG. 2, a solid line (—) indicates the first region of a polarizer (or polarizing plate) according to one embodiment of the invention, a dotted line (----) is a polarizing plate including the second region alone without the first region, and a dash-dot dotted line (—·—) indicates a region of the polarizing plate irradiated with femtosecond laser beams.

Referring to FIG. 1, the polarizing plate (----) including the second region alone without the first region has a maximum absorbance of 0 to 1 at a wavelength of 270 nm to 800 nm, indicating a low maximum absorbance in the overall wavelength range. A typical polarizing plate including a region (—·—), which is formed through irradiation with femtosecond laser beams to have high total transmittance in the art, has a lower maximum absorbance in the overall wavelength range of 270 nm to 800 nm than the polarizing plate (----) including the second region alone without the first region.

Conversely, the first region (—) of the polarizing plate according to the embodiment has a lower maximum light absorbance at a wavelength of 420 nm or more than the polarizing plate (----) including the second region alone without the first region, the first region (—) of the polarizing plate according to the embodiment has substantially same absorbance as in the region irradiated with the femtosecond laser beams.

However, the first region of the polarizing plate according to the embodiment has a higher maximum absorbance in the overall wavelength range of 270 nm to 420 nm than the polarizing plate (----) including the second region alone without the first region and the region (—·—) irradiated with the femtosecond laser beams.

In particular, the first region of the polarizing plate according to the present invention has two absorption peaks exhibiting the maximum absorbance in the overall wavelength range of about 270 nm to about 420 nm, that is, a first absorption peak in the wavelength range of about 270 nm to about 325 nm and a second absorption peak in the wavelength range of greater than about 325 nm to about 420 nm, and the first region has the maximum absorbance within the above specific ranges in the wavelength range of about 270 nm to about 325 nm and in the wavelength range of greater than about 325 nm to about 420 nm. As compared to the polarizing plate (—·—) formed to achieve substantial improvement in total transmittance through complete decomposition of iodine through irradiation with femtosecond laser beams in the art, the first region of the polarizing plate according to the present invention has the aforementioned relationship between wavelength and absorbance, thereby achieving the effects of the present invention described above.

In one embodiment, the first region of the polarizing plate according to the present invention may have a maximum absorbance of 1.0 to 5.0, for example, 1.0, 1.5, 2.0, 2.5, 3.0, 3.5, 4.0, 4.5, 5.0, specifically greater than 1.0 to 5.0, 1.5 to 5.0, 1.5 to 4.5, 1.5 to 3.0, 1.5 to 2.5, or 1.5 to 2.0, in the wavelength range of about 270 nm to about 325 nm. Within this range, the first region can further improve the effects of the present invention. The first region may exhibit the maximum absorbance at a wavelength of about 295 nm of the wavelength range of about 270 nm to about 325 nm.

In one embodiment, the first region of the polarizing plate according to the present invention may have a maximum absorbance of 0.5 to 4.0, for example, 0.5, 1.0, 1.5, 2.0, 2.5, 3.0, 3.5, 4.0, specifically greater than 0.5 to 4.0, 1.0 to 4.0, 1.0 to 3.0, 1.0 to 2.0, or 1.0 to 1.5, in the wavelength range of greater than about 325 nm to about 420 nm. Within this range, the first region can further improve the effects of the present invention. More preferably, the first region has the maximum absorbance at a wavelength of about 355 nm of the wavelength range of greater than about 325 nm to about 420 nm.

In one embodiment, the first region of the polarizing plate according to the present invention may have a higher maximum absorbance in the wavelength range of about 270 nm to about 325 nm than the maximum absorbance in the wavelength range of greater than about 325 nm to about 420 nm. With this configuration, the first region can further improve the effects of the present invention.

In one embodiment, in the first region of the polarizing plate, a ratio of the maximum absorbance in the wavelength range of about 270 nm to about 325 nm to the maximum absorbance in the wavelength range of greater than about 325 nm to about 420 nm may be in the range of greater than 1 to 5, for example, 1.1, 1.5, 2, 2.5, 3, 3.5, 4, 4.5, or 5, specifically 1.1 to 5.0, or 1.1 to 2.0. Within this range, the effects of the present invention can be more efficiently realized.

In one embodiment, the first region of the polarizing plate may have a maximum absorbance of 0.5 or less, for example, 0, 0.1, 0.2, 0.3, 0.4, 0.5, 0 to 0.5, 0.1 to 0.5, or 0.15 to 0.5, in the wavelength range of about 500 nm to about 800 nm. Within this range, the effects of the present invention can be more efficiently realized.

The effects of the present invention realized by the first region according to the present invention can be understood through FIG. 2.

Referring to FIG. 2, the polarizing plate according to the present invention has a lower total transmittance in the wavelength range of about 300 nm to about 400 nm than the polarizing plate formed to achieve substantial improvement in total transmittance through complete decomposition of iodine through irradiation with femtosecond laser beams in the art and or the polarizing plate including the second region alone without the first region.

As such, the polarizing plate according to the present invention has the aforementioned relationship between wavelength and total transmittance, thereby providing the effects of the present invention described above, as compared to the polarizing plate (———) suffering from reduction in crystallinity of a polyvinyl alcohol film or a polarizer due to strong energy of laser beams, despite substantial improvement in total transmittance through complete decomposition of iodine through irradiation with femtosecond laser beams.

In one embodiment, the first region of the polarizing has a lower total transmittance in the overall wavelength range of about 270 nm to about 420 nm than the second region and has a higher total transmittance in the overall wavelength range of greater than about 420 nm to about 800 nm than the second region. With this configuration, the first region can further improve the effects of the present invention.

In one embodiment, the first region of the polarizing plate may have a total transmittance of 15% or less, for example, 0%, 5%, 10%, or 15%, specifically 0% to 15%, in the wavelength range of about 270 nm to about 325 nm. Within this range, the first region can further improve the effects of the present invention. As shown in FIG. 2, this feature of the first region is distinguished from the feature that the region formed through irradiation with femtosecond laser beams in the art has a total transmittance of greater than 45% in the wavelength range of about 270 nm to about 325 nm. More preferably, the first region exhibits the maximum peak of the total transmittance at a wavelength of about 295 nm.

In one embodiment, the first region of the polarizing plate may have a total transmittance of 25% or less, for example, 0%, 5%, 10%, 15%, 20%, or 25%, specifically 0% to 25%, in the wavelength range of greater than about 325 nm to about 420 nm. Within this range, the first region can further improve the effects of the present invention. As shown in FIG. 2, this feature of the first region is distinguished from the feature that the region formed through irradiation with femtosecond laser beams in the art has a total transmittance of greater than 50% in the wavelength range of greater than about 325 nm to about 420 nm. More preferably, the first region exhibits the maximum peak of the total transmittance at a wavelength of 355 nm in the wavelength range of greater than about 325 nm to about 420 nm.

In one embodiment, the first region of the polarizing plate may have a total transmittance of 45% or more, for example, 45%, 50%, 55%, 60%, 65%, 70%, 75%, 80%, 85%, 90%, or 95%, specifically 45% to 95%, in the wavelength range of about 500 nm to about 800 nm. Within this range, the first region can further improve the effects of the present invention.

In the polarizing plate according to the present invention, the second region may exhibit the absorbance and the total transmittance according to a dotted line (- - - -) in FIG. 1 and FIG. 2.

The second region may have a lower maximum absorbance in the wavelength range of about 270 nm to about 420 nm and a higher maximum absorbance in the wavelength range of greater than about 420 nm to about 800 nm than the first region.

In one embodiment, the second region may have a maximum absorbance of 0.5 to 3.0, for example, 0.5, 1.0, 1.5, 2.0, 2.5, or 3.0, specifically 0.5 to 2.0, or 0.5 to 1.0, in the wavelength region of about 270 nm to about 420 nm. In the polarizing plate according to the present invention, the first region having the above light absorbance may be formed by irradiating the polarizing plate including the second region having the above light absorbance with pulsed UV beams described below.

In one embodiment, the second region may have a maximum absorbance of 0 to 0.6, for example, 0, 0.1, 0.2, 0.3, 0.4, 0.5, or 0.6, specifically greater than 0 to 0.6, in the wavelength range of greater than about 420 nm to about 800 nm, for example, in the wavelength range of about 500 nm to about 800 nm. In the polarizing plate according to the present invention, the first region having the above light absorbance may be formed by irradiating the polarizing plate including the second region having the above light absorbance with pulsed UV beams described below.

The polarizing plate includes a polarizer and a protective layer formed on at least one surface of the polarizer. In one embodiment, the polarizing plate includes a polarizer and protective films respectively formed on opposite surfaces of the polarizer. In another embodiment, the polarizing plate may include a polarizer and a protective film formed only on one surface of the polarizer.

The polarizing plate according to the present invention will be described with reference to FIG. 3.

Figure 3:
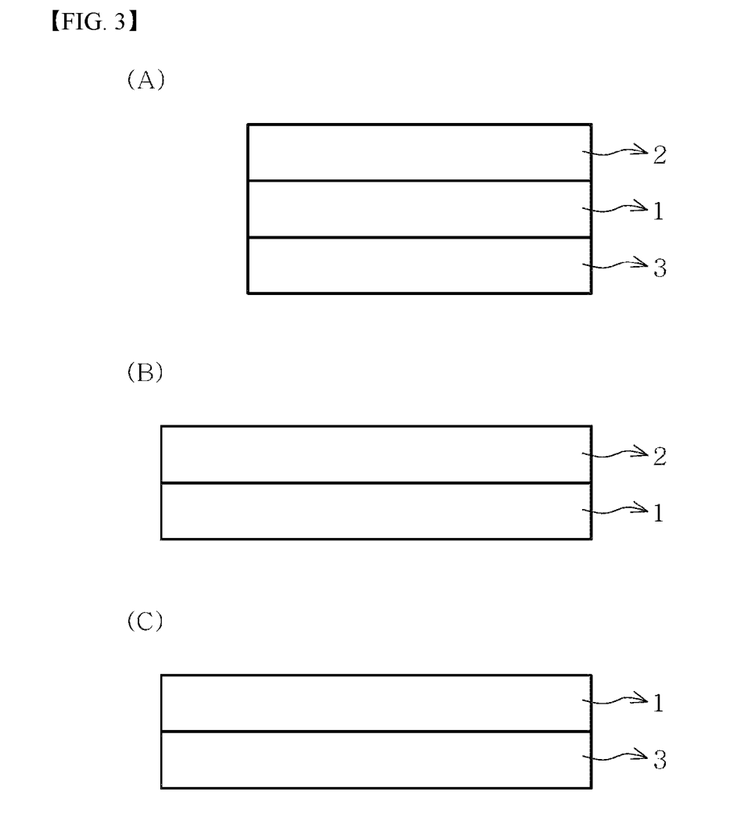
FIG. 3 is sectional views of polarizing plates according to embodiments of the present invention.

Referring to FIG. 3, a polarizing plate A may include a polarizer 1, a first protective layer 2 formed on a light exit surface of the polarizer 1, and a second protective layer 3 formed on a light incidence surface of the polarizer. Alternatively, the polarizing plate B may include a polarizer 1 and only a first protective layer 2 formed on a light exit surface of the polarizer 1. Alternatively, the polarizing plate C may include a polarizer 1 and only a second protective layer 3 formed on a light incidence surface of the polarizer 1.

Figure 4:
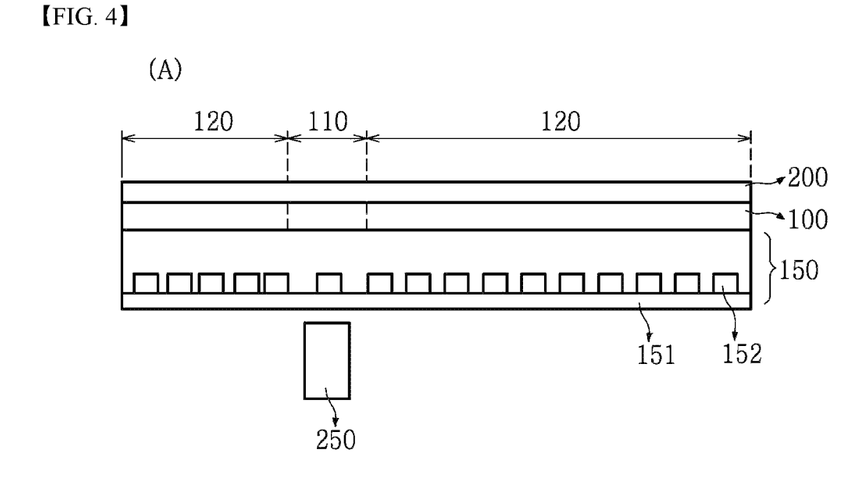
FIG. 4 is a sectional view of an optical display device including a polarizing plate according to the present invention.

Next, a polarizing plate according to one embodiment of the invention will be described with reference to FIG. 4. FIG. 4 is a sectional view of an optical display device including the polarizing plate according to the present invention.

Referring to FIG. 4, a polarizing plate 100 includes a first region 110 and a second region 120.

The entirety of the first region 110 and the second region 120 of the polarizing plate 100 is disposed between a display panel 150 and a cover glass 200. The display panel 150 includes light emitting diodes 152 on the baser layer 151 to display an image. Accordingly, the first region 110 and the second region 120 are included in an image display region.

The optical display device is provided with an image sensor 250 disposed under the display panel 150 and corresponding to the first region 110. Accordingly, the first region 110 can realize an image display function through suppression of visual observation of the image sensor at the outside in non-use of the image sensor 250 while improving resolution of an image through an image photographing function by the image sensor 250 in use of the image sensor 250. In a laminate of the image sensor 250, the light emitting diode-containing display panel 150, and the polarizing plate 100 in the optical display device, the first region 110 can realize all of the aforementioned effects.

The first region 110 may occupy an area ratio of 10% or less, specifically greater than 0% to 10%, in the polarizing plate, preferably in the entirety of the first region 110 and the second region 120. Within this range, the first region can provide an image sensor function.

The first region 110 may have a circular, elliptical, angled or amorphous shape, without being limited thereto.

In the polarizing plate, the first region 110 may be placed at any location without limitation and may be placed corresponding to the location of the image sensor 250 in the optical display device.

Next, a method of manufacturing the polarizing plate including the first region 110 and the second region 120 according to one embodiment of the invention will be described.

The polarizing plate according to the present invention may be manufactured by preparing a laminate of a polarizer (not formed with a first region and a second region) and a protective layer formed on at least one surface of the polarizer (not formed with the first region and the second region), followed by irradiating a predetermined region of the laminate with pulsed UV laser beams at a wavelength of about 200 nm to about 1,000 nm to form the first region. A region of the laminate not irradiated with the pulsed UV laser beams becomes the second region. Irradiation with the pulsed UV laser beams at a wavelength of about 200 nm to about 1,000 nm can form the first region described above.

A polarizing plate not including an upper protective layer allows formation of a local high transmittance hole having 3% to 5% higher transmittance than a polarizing plate including the upper protective layer, upon processing with the same pulsed UV energy. It is presumed that this result is obtained since pulsed UV energy loss is reduced on the upper protective layer to provide better processability. Further, the polarizing plate not including the upper protective layer suffers from deterioration in processing accuracy in a final polarizer due to refraction of pulsed UV light passing through the upper protective layer after passing through a mask. Processing accuracy can be further improved upon processing with the mask directly placed on the polarizer without the upper protective layer.

The polarizer (not formed with the first region and the second region) includes a polyvinyl alcohol film dyed with iodine and/or dichroic dyes and stretched. The polarizer (not formed with the first region and the second region) may have a thickness of about 3 μm to about 50 μm, specifically about 3 μm to about 30 μm. Within this range, the polarizer can be used in the polarizing plate.

The polarizer (not formed with the first region and the second region) may be manufactured by a typical method known to those skilled in the art.

First, the dyed and stretched polyvinyl alcohol film is manufactured.

The dyed and stretched polyvinyl alcohol film may be manufactured through dyeing, stretching, cross-linking, and color correction processes. In the method of manufacturing the polarizer according to the present invention, dyeing and stretching may be performed in any sequence. That is, the polyvinyl alcohol film may be dyed and then stretched or vice versa, or may be simultaneously subjected to dyeing and stretching.

The polyvinyl alcohol film may be a typical polyvinyl alcohol film used in manufacture of a typical polarizer. Specifically, the polyvinyl alcohol film may be a film produced from polyvinyl alcohol or derivatives thereof. The polyvinyl alcohol film may have a degree of polymerization of about 1,000 to about 5,000, a degree of saponification of about 80 mol % to about 100 mol %, and a thickness of about 1 μm to about 30 μm, specifically about 3 μm to about 30 μm. Within this range, the polyvinyl alcohol film can be used in manufacture of a thin polarizer.

The polyvinyl alcohol film may be subjected to washing with water and swelling before dyeing and stretching. The polyvinyl alcohol film may be subjected to washing with water to remove foreign matter from the surface of the polyvinyl alcohol film. The polyvinyl alcohol film may be subjected to swelling to allow more efficient dyeing or stretching of the polyvinyl alcohol film. Swelling may be realized by leaving the polyvinyl alcohol film in an aqueous solution of a swelling bath, as well-known to those skilled in the art. The temperature of the swelling bath and swelling time are not particularly limited. The swelling bath may further include boric acid, an inorganic acid, a surfactant, and the like, and the content of these components may be adjusted.

The polyvinyl alcohol film may be dyed by dipping the polyvinyl alcohol film in a dyeing bath containing iodine and/or dichroic dyes. In the dying process, the polyvinyl alcohol film is dipped in a dyeing solution, which may be an aqueous solution containing iodine and/or dichroic dyes. Specifically, iodine is provided in the form of an iodine-based dye. The iodine-based dye may include at least one selected from among potassium iodide, hydrogen iodide, lithium iodide, sodium iodide, zinc iodide, aluminum iodide, lead iodide, and copper iodide. The dying solution may be an aqueous solution containing about 1 wt % to about 5 wt % of iodine and/or dichroic dyes. Within this range, the polarizer has a degree of polarization within a predetermined range to be used in a display device.

The dyeing bath may have a temperature of about 20° C. to about 45° C. and the polyvinyl alcohol film may be dipped in the dyeing bath for about 10 seconds to about 300 seconds. Within this range, it is possible to realize a polarizer having a high degree of polarization.

The dyed polyvinyl alcohol film may be stretched in a stretching bath to exhibit polarization through alignment of iodine and/or dichroic dyes. Specifically, stretching may be realized by dry stretching and wet stretching. Dry stretching may be performed by inter-roll stretching, compression stretching, hot-roll stretching, and the like, and wet stretching may be performed in a wet stretching bath containing water at about 35° C. to about 65° C. The wet stretching bath may further contain boric acid to improve the stretching effect.

The polyvinyl alcohol film may be stretched at a certain stretching ratio, specifically a total stretching ratio of about 5 times to about 7 times, more specifically about 5.5 times to about 6.5 times. Within this range, the polyvinyl alcohol film can prevent cutting, wrinkling and the like upon stretching, and can realize a polarizer achieving improvement in polarization degree and transmittance. Stretching may be performed by uniaxial stretching through single-stage stretching or multi-stage stretching, such as bi-stage stretching and tri-stage stretching, thereby preventing fracture of the polyvinyl alcohol film in manufacture of a thin polarizer.

Although dyeing and stretching of the polyvinyl alcohol film are performed in the stated sequence in the above embodiment, dyeing and stretching may be performed in the same reaction bath.

Before or after the dyed polyvinyl alcohol film is stretched, the polyvinyl alcohol film may be subjected to crosslinking in a crosslinking bath. Crosslinking is a process that allows the polyvinyl alcohol film to be more strongly dyed with iodine and/or dichroic dyes, and may be performed using boric acid as a crosslinking agent. In order to enhance the crosslinking effect, the crosslinking bath may further contain a phosphoric acid compound, potassium iodide, or the like.

The dyed and stretched polyvinyl alcohol film may be subjected to color correction in a color correction bath. In color correction, the dyed and stretched polyvinyl alcohol film is dipped in the color correction bath filled with a color correction solution containing potassium iodide. As a result, the polarizer has reduced color values and iodine cations (I⁻) are removed from the polarizer, thereby improving durability. The color correction bath may have a temperature of about 20° C. to about 45° C. and the polyvinyl alcohol film may be dipped therein for about 10 seconds to about 300 seconds.

Next, the laminate is manufactured by forming a protective layer on at least one surface of the dyed and stretched polyvinyl alcohol film. The protective layer may be manufactured by a typical method known to those skilled in the art.

The protective layer is formed on at least one surface of the polarizer and may be a photocurable coating layer or protective film.

The photocurable coating layer may include a cured layer formed of a composition including a photocurable compound or a liquid crystal layer formed of a liquid crystal polymer.

The protective film may be a typical protective film used as a protective film for polarizers. By way of example, the protective film may include a protective film formed of at least one resin selected from among cellulose resins including triacetylcellulose and the like, polyester resins including polyethylene terephthalate, polybutylene terephthalate, polyethylene naphthalate, polybutylene naphthalate, and the like, cyclic polyolefin resins, polycarbonate resins, polyether sulfone resins, polysulfone resins, polyamide resins, polyimide resins, polyolefin resins, polyarylate resins, polyvinyl alcohol resins, polyvinyl chloride resins, and polyvinylidene chloride resins. The protective film may have a thickness of about 10 µm to about 100 for example, about 10 µm to about 60 Lamination may be performed using a bonding agent by a typical method known to those skilled in the art.

The protective layer may include at least one of a retardation film, a retardation layer, a non-retardation film, and a non-retardation layer.

Thereafter, the first region is formed by irradiating a predetermined region of the laminate with pulsed UV laser beams at a wavelength of about 200 nm to about 1,000 nm.

The pulsed UV laser beams in the wavelength range of about 200 nm to about 1,000 nm decompose iodine and the dichroic dyes in the polarizer through transfer of iodine and the dichroic dyes from a ground state to an excited state, thereby forming the first region in a region irradiated therewith.

However, even after irradiation with the pulsed UV laser beams in the wavelength range of about 200 nm to about 1,000 nm, dichroic substances, such as iodine and dichroic dyes, are present in the region of the polarizer corresponding to the first region.

Specifically, irradiation may be performed using pulsed laser beams in the wavelength range of about 200 nm to about 1,000 nm, preferably about 200 nm to about 800 nm.

The pulsed laser beams in the wavelength range of about 200 nm to about 1,000 nm may be emitted at a voltage of about 200 V to about 750 V. The pulsed laser beams in the wavelength range of about 200 nm to about 1,000 nm may be emitted at a pulse period of 300 µs to about 600 µs (irradiation time on irradiation once). The pulsed laser beams in the wavelength range of about 200 nm to about 1,000 nm may be emitted at an irradiation energy density of about 2.0 J/cm$^2$ to about 5.0 J/cm$^2$. The pulsed laser beams in the wavelength range of about 200 nm to about 1,000 nm may be irradiated at an intensity of laser of about 2 kw/cm$^2$ to about 30 kw/cm$^2$ upon irradiation once. Within this range, the first region can achieve a light transmittance of about 45% to about 85% without carbonization of a processed surface of the polarizer by heat. The "irradiation energy density" means irradiation energy per pulse per unit area in a region of the polarizer having high light transmittance such as the second region.

In one embodiment, irradiation with the pulsed laser beams in the wavelength range of about 200 nm to about 1,000 nm at a pulse period of about 460 µs may be performed for about 1 second to about 400 seconds, for example, for about 1 second to about 40 seconds. Within this range, it is possible to form a neutral colorless region having high transmittance through increase in irradiation time or the number of irradiation times under the above conditions without thermal deformation of the polarizer and the protective film.

Irradiation with the pulsed laser beams in the wavelength range of about 200 nm to about 1,000 nm may be performed once to 20 times. Within this range, it is possible to form a neutral colorless region having high transmittance through increase in irradiation time or the number of irradiation times under the above conditions without thermal deformation of the polarizer and the protective film.

The pulsed UV beams may be emitted through a xenon flash lamp. Specifically, with the polarizer (not formed with the first region and the second region) placed on a ceramic substrate, a mask having a masking (through formation of, for example: a ceramic material or photomask Cr) only formed in a region of the polarizer (not formed with the first region and the second region) other than the first region, that is, in the second region, is positioned on the polarizer, followed by irradiation on the mask with pulsed UV beams to form the first region. In general, a typical mask material having low reflectivity and low thermal conductivity is known in the art.

The polarizer formed with the first region and the second region may have a thickness of about 3 µm to about 50 µm specifically about 3 µm to about 30 µm. Within this range, the polarizer can be used in the polarizing plate.

Next, a polarizing plate according to another embodiment of the invention will be described.

The polarizing plate according to this embodiment includes a polarizer and a protective layer formed on at least one surface of the polarizer, wherein the polarizer includes a first region and a second region in an image display region, the first region and the second region have different total transmittances at the same wavelength, the first region has a total transmittance of 45% to 85%, and the first region has a maximum absorbance of 1.0 to 5.0 in the wavelength range of about 270 nm to about 325 nm, a maximum absorbance of 0.5 to 4.0 in the wavelength range of greater than about 325 nm to about 420 nm, and a maximum absorbance of 0.5 or less in the wavelength range of about 500 nm to about 800 nm.

The polarizing plate according to this embodiment is substantially the same as the polarizing plate according to the above embodiment except that the first region formed in the polarizer and the second region formed in the polarizer have substantially the same properties of the first region and the second region formed in the polarizing plate according to the above embodiment.

Next, an optical display device according to one embodiment of the invention will be described.

The optical display device according to the present invention includes the polarizing plate according to the present invention. The optical display device may include an organic light emitting diode display, a liquid crystal display, and the like, preferably an organic light emitting diode display.

The optical display device according to the present invention will be described in more detail with reference to FIG. 4.

Referring to FIG. 4, the optical display device includes a display panel 150, which includes a base layer 151 and light emitting diodes 152, a polarizing plate 100 formed on the display panel 150, a cover glass 200 formed on the polarizing plate 100, and an image sensor 250 disposed under the display panel 150. The display panel 150 is not formed with a through-hole into which the image sensor 250 is inserted.

The polarizing plate 100 includes a first region 110 and a second region 120. The polarizing plate includes the polarizing plate according to the present invention. Both the first region 110 and the second region 120 constitute image display regions of the optical display device. The polarizing plate 100 is not formed with a through-hole into which the image sensor 250 is inserted.

The first region 110 is less densely provided with the light emitting diodes 151 than the second region 120. With this structure, the first region can realize an image display function through the image sensor 250, while realizing a display function through the display panel 150.

The image sensor 250 is disposed under the first region 110. The image sensor 250 may include a camera, without being limited thereto.

MODE FOR INVENTION

Next, the present invention will be described in more detail with reference to some examples. However, it should be noted that these examples are provided for illustration only and are not to be construed in any way as limiting the invention.

Detailed specifications of components used in Examples and Comparative Examples are as follows.
(1) Material of polarizer: Polyvinyl alcohol based film (VF-PE3000, thickness: 30 μm, Kuraray Co., Ltd., Japan)
(2) Protective film: Triacetylcellulose film (KC4UYW, thickness: 40 μm, Konica Co., Ltd., Japan)

Example 1

A polyvinyl alcohol based film washed with water was subjected to swelling treatment in a swelling bath filled with water at 30° C.

After swelling treatment, the polyvinyl alcohol based film was dyed with an aqueous solution containing 3 wt % of potassium iodide in a dyeing bath at 30° C. for 30 seconds to 200 seconds. The dyed polyvinyl alcohol based film was passed through a wet crosslinking bath filled with an aqueous solution containing 3 wt % of boric acid at 30° C. to 60° C. Thereafter, the polyvinyl alcohol based film was stretched in an aqueous solution containing 3 wt % of boric acid at 50° C. to 60° C. to reach a total stretching ratio of 6 times an initial length thereof, thereby producing a polarizer. A laminate was prepared by bonding protective films to both surfaces of the prepared polarizer using a bonding agent (Z-200, Nippon Goshei Co., Ltd.).

The laminate was cut to a predetermined size and a target region of the laminate was only irradiated with pulsed UV beams at a wavelength of 200 nm to 800 nm under the conditions set forth in Table 1, thereby fabricating a polarizing plate formed with a first region. A region of the polarizing plate not irradiated with the pulsed UV beams became a second region.

Examples 2 to 4

Polarizing plates each having a first region and a second region were fabricated in the same manner as in Example 1 except that conditions for irradiation with pulsed UV beams were changed, as listed in Table 1.

Example 5

A polarizing plate having a first region and a second region was fabricated in the same manner as in Example 1 except that a protective film was bonded only to an upper surface of the polarizer.

Comparative Example 1

A polarizing plate was fabricated in the same manner as in Example 1 except that irradiation with pulsed UV beams was not performed. The polarizing plate includes the second region alone without the first region.

Comparative Example 2

A polarizing plate was fabricated in the same manner as in Example 1 except that a region of the polarizing plate irradiated with the pulsed UV beams in Example 1 was irradiated with femtosecond laser beams having a wavelength of 515 nm at an intensity of 0.17 J/(cm$^2$·pulse) for 0.5 seconds instead of the pulsed UV beams.

The polarizing plates fabricated in Examples and Comparative Examples were evaluated as to the following properties and evaluation results are shown in Table 1 and FIGS. 1 and 2.
  (1) Absorbance of first region and second region (unit: no unit): Absorbance was measured at a wavelength of 200 nm to 800 nm on each of the first region and the second region of each of the polarizing plates fabricated in Examples and Comparative Examples using a UV-Visible Spectrophotometer V730 (JASCO).
  (2) Total transmittance of first region and second region (unit: %): Total transmittance was measured at a wavelength of 200 nm to 800 nm on each of the first region and the second region of each of the polarizing plates fabricated in Examples and Comparative Examples using a UV-Visible Spectrophotometer V730 (JASCO).
  (3) Visual observation of camera and image resolution of camera: With a camera disposed under the first region of each of the polarizing plates, visual observation of the camera and an image resulting therefrom were observed above the polarizing plate. A polarizing plate providing a difference in the degree of polarization between the first region and the second region without visual observation of a camera lens while providing a high resolution image through the camera was rated as ⊚, a polarizing plate allowing slight observation of a camera lens but the camera is not observed at outside while providing a high resolution image through the camera was rated as ○; a polarizing plate providing allowing much observation of a camera lens while providing a high resolution image through the camera was rated as Δ; a polarizing plate providing no difference between the first region and the second region and a poor resolution image through the camera was rated as x.
  (4) Durability: Each of the polarizing plates fabricated in Examples and Comparative Examples polarizer was cut into a square specimen having a size of 10 cm×10 cm (MD×TD of polarizer). The specimen was a polarizing plate including a first region. In the specimen, total transmittance in the first region was measured at a wavelength of 550 nm. Thereafter, the specimen was left at 85° C. for 120 hours, followed by measurement of total transmittance at a wavelength of 550 nm in the same manner. Variation rate of total transmittance was calculated according to Equation 1.

(5) Reflectivity (unit: %): A camera was placed under a region of polarizing plate corresponding to the first region. Reflectivity of each of the first region and the second region was measured. Reflectivity was measured by the SCI method using a colorimeter.

TABLE 1

|  |  |  | Example | | | | | Comparative Example | |
|---|---|---|---|---|---|---|---|---|---|
|  |  |  | 1 | 2 | 3 | 4 | 5 | 1 | 2 |
| Pulsed UV beam Power(V) | | | 400 | 350 | 300 | 280 | 400 | — | — |
| Pulsed UV beam energy density (J/cm$^2$) | | | 5.0 | 4.0 | 3.0 | 2.5 | 5.0 | — | — |
| Femtosecond laser J/(cm$^2$ · pulse) | | | — | — | — | — | — | — | 0.17 |
| Absorbance | First region | @270 to 325 | 1.0-4.5 (4.5) | 1.0-3.5 (3.5) | 1.0-2.5 (2.5) | 1.0-1.5 (1.5) | 1.0-4.5 (4.5) | — | 0.2-0.4 (0.4) |
| | | @325 to 420 | 0.5-3.5 (3.5) | 0.5-2.5 (2.5) | 0.5-2.0 (2.0) | 0.5-1.0 (1.0) | 0.5-3.5 (3.5) | — | 0-0.2 (0.2) |
| | | @500 to 800 | 0.15 or less (0.15) | 0.18 or less (0.18) | 0.2 or less (0.2) | 0.3 or less (0.3) | 0.15 or less (0.15) | — | 0.1 or less (0.1) |
| Absorbance | Second region | @270 to 325 | 0.5-1.0 (1.0) | 0.5-3.0 (3.0) | 0.5-2.0 (2.0) | 0.5-1.0 (1.0) | 0.5-1.0 (1.0) | 0.5-1.0 (1.0) | 0.5-1.0 (1.0) |
| | | @325 to 420 | 0.5-0.8 (0.8) | 0.5-0.8 (0.8) | 0.5-0.8 (0.8) | 0.5-0.8 (0.8) | 0.5-0.8 (0.8) | 0.5-0.8 (0.8) | 0.5-0.8 (0.8) |
| | | @500 to 800 | 0.5 or less (0.5) | 0.5 or less (0.5) | 0.5 or less (0.5) | 0.5 or less (0.5) | 0.5 or less (0.5) | 0.5 or less (0.5) | 0.5 or less (0.5) |
| Total transmittance | First region | @200 to 800 | 80 | 70 | 60 | 50 | 85 | 44 | 90 |
| Total transmittance | Second region | @200 to 800 | 44 | 44 | 44 | 44 | 44 | 44 | 44 |
| Visual observation of camera and image resolution | | | ○ | ○ | ◉ | ◉ | ○ | X | △ |
| Durability (%) | | | 5 or less | 5 or less | 5 or less | 5 or less | 5 or less | — | 20 or more |
| Reflectivity (SCI) | First region | | 25 | 15 | 11 | 6 | 6 | — | 25 |
| | Second region | | 4 | 4 | 4 | 4 | 4 | 4 | 4 |

* In Table 1, the numeral in ( ) indicates the maximum absorbance at the corresponding wavelength.

As shown in Table 1, when applied to an optical display device, the polarizing plate according to the present invention could suppress visual observation of an image sensor, such as a camera and the like, while increasing resolution of an image in use of the image sensor and securing good durability. Although not shown in Table 1, the polarizer according to the present had substantially the same absorbance and total transmittance as listed in Table 1.

Conversely, the polarizing plate not formed with the first region in Comparative Example 1 provided a poor image through the camera. The polarizing plate formed with the first region through irradiation with femtosecond laser beams in Comparative Example 2 allowed severe observation of a camera lens and thus failed to realize an image display function.

It should be understood that various modifications, changes, alterations, and equivalent embodiments can be made by those skilled in the art without departing from the spirit and scope of the present invention.

The invention claimed is:

1. A polarizing plate including a polarizer and a protective layer formed on at least one surface of the polarizer, the polarizing plate comprising a first region and a second region in an image display region,
   wherein the first region and the second region have different total transmittances at the same wavelength;
   a difference in total transmittance between the first region and the second region is in the range of 5% to 45%; and
   the first region has a total transmittance of 45% to 85%, the first region has a maximum absorbance of 1.0 to 5.0 in the wavelength range of about 270 nm to about 325 nm, a maximum absorbance of 0.5 to 4.0 in the wavelength range of greater than about 325 nm to about 420 nm, and a maximum absorbance of 0.5 or less in the wavelength range of about 500 nm to about 800 nm.

2. The polarizing plate according to claim 1, wherein the first region has a maximum absorbance of greater than 1.0 to 5.0 in the wavelength range of about 270 nm to about 325 nm and a maximum absorbance of greater than 0.5 to 4.0 in the wavelength range of greater than about 325 nm to about 420 nm.

3. The polarizing plate according to claim 1, wherein, in the first region, the maximum absorbance in the wavelength range of about 270 nm to about 325 nm is higher than the maximum absorbance in the wavelength range of greater than about 325 nm to about 420 nm.

4. The polarizing plate according to claim 1, wherein the second region has a lower maximum absorbance in the wavelength range of about 270 nm to about 420 nm than the first region and the second region has a higher maximum absorbance in the wavelength range of greater than about 420 nm to about 800 nm than the first region.

5. The polarizing plate according to claim 4, wherein the second region has a maximum absorbance of 0.5 to 3.0 in the wavelength range of about 270 nm to about 420 nm and a maximum absorbance of 0 to 0.6 in the wavelength range of greater than about 420 nm to about 800 nm.

6. The polarizing plate according to claim 1, wherein the first region has a lower total transmittance in the wavelength range of about 270 nm to about 420 nm than the second region and the first region has a higher total transmittance in the wavelength range of greater than about 420 nm to about 800 nm than the second region.

7. The polarizing plate according to claim 1, wherein the first region has a total transmittance of 15% or less in the wavelength range of about 270 nm to about 325 nm, a total transmittance of 25% or less in the wavelength range of greater than about 325 nm to about 420 nm, and the total transmittance of 45% to 85% in the wavelength range of about 500 nm to about 800 nm.

8. An optical display device comprising the polarizing plate according to claim 1.

9. The optical display device according to claim 8, comprising:
a display panel; the polarizing plate formed on an upper surface of the display panel; an image sensor formed under the display panel, the image sensor being disposed under the first region of the polarizing plate.

10. A polarizing plate comprising a polarizer and a protective layer formed on at least one surface of the polarizer,
wherein the polarizer comprises a first region and a second region in an image display region,
the first region and the second region having different total transmittances at the same wavelength;
a difference in total transmittance between the first region and the second region is in the range of 5% to 45%; and
the first region has a total transmittance of 45% to 85%, the first region has a maximum absorbance of 1.0 to 5.0 in the wavelength range of about 270 nm to about 325 nm, a maximum absorbance of 0.5 to 4.0 in the wavelength range of greater than about 325 nm to about 420 nm, and a maximum absorbance of 0.5 or less in the wavelength range of about 500 nm to about 800 nm.

11. An optical display device comprising the polarizing plate according to claim 10.

12. The optical display device according to claim 11, comprising: a display panel; the polarizing plate formed on an upper surface of the display panel; an image sensor formed under the display panel, the image sensor being disposed under the first region of the polarizing plate.

13. A polarizing plate including a polarizer and a protective layer formed on at least one surface of the polarizer,
the polarizing plate comprising a first region and a second region in an image display region,
wherein the first region and the second region have different total transmittances at the same wavelength;
a difference in total transmittance between the first region and the second region is in the range of 5% to 45%; and
the first region has a total transmittance variation rate of 10% or less, as calculated by Equation 1:

Total transmittance variation rate=$(TS1-TS2)/TS1 \times 100$, where, in Equation 1,
TS1 is total transmittance of the first region at a wavelength of 550 nm (unit: %), and
TS2 is total transmittance of the first region at a wavelength of 550 nm (unit: %) after the polarizing plate is left under 85° C. for 120 hours or under conditions of 85° C. and 85% relative humidity (RH) for 120 hours (unit: %).

14. The polarizing plate according to claim 13, wherein the first region has a total transmittance of 45% to 85%, wherein the first region has a maximum absorbance of 1.0 to 5.0 in the wavelength range of about 270 nm to about 325 nm, a maximum absorbance of 0.5 to 4.0 in the wavelength range of greater than about 325 nm to about 420 nm, and a maximum absorbance of 0.5 or less in the wavelength range of about 500 nm to about 800 nm.

15. The polarizing plate according to claim 14, wherein the first region has a maximum absorbance of greater than 1.0 to 5.0 in the wavelength range of about 270 nm to about 325 nm and a maximum absorbance of greater than 0.5 to 4.0 in the wavelength range of greater than about 325 nm to about 420 nm.

16. The polarizing plate according to claim 13, wherein the second region has a maximum absorbance of 0.5 to 3.0 in the wavelength range of about 270 nm to about 420 nm and a maximum absorbance of 0 to 0.6 in the wavelength range of greater than about 420 nm to about 800 nm.

17. An optical display device comprising the polarizing plate according to claim 13.

18. The optical display device according to claim 17, comprising: a display panel; the polarizing plate formed on an upper surface of the display panel; an image sensor formed under the display panel, the image sensor being disposed under the first region of the polarizing plate.

* * * * *